US012149263B2

(12) United States Patent
Isik et al.

(10) Patent No.: US 12,149,263 B2
(45) Date of Patent: Nov. 19, 2024

(54) COMPUTATIONALLY EFFICIENT AND BITRATE SCALABLE SOFT VECTOR QUANTIZATION

(71) Applicant: Cisco Technology, Inc., San Jose, CA (US)

(72) Inventors: Yusuf Ziya Isik, Edinburgh (GB); Amir Salah Abdelsamie Abdelwahed, Cracow (PL); Xuehong Mao, San Jose, CA (US); Ivana M. Balic, Studen (SE); Samer Lutfi Hijazi, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 17 days.

(21) Appl. No.: 18/079,441

(22) Filed: Dec. 12, 2022

(65) Prior Publication Data
US 2024/0195438 A1    Jun. 13, 2024

(51) Int. Cl.
*H03M 13/00* (2006.01)
*H03M 7/30* (2006.01)

(52) U.S. Cl.
CPC ..... *H03M 13/6312* (2013.01); *H03M 7/3059* (2013.01); *H03M 13/6577* (2013.01)

(58) Field of Classification Search
CPC ......... H03M 13/6312; H03M 13/6577; H03M 7/3059
See application file for complete search history.

(56) References Cited

U.S. PATENT DOCUMENTS

| | | | | |
|---|---|---|---|---|
| 9,277,234 B1* | 3/2016 | Whillock | ............... | H03M 7/30 |
| 10,511,324 B1* | 12/2019 | Goyal | ............... | H03M 7/4006 |
| 2009/0174583 A1* | 7/2009 | Diaz-Gutierrez | ....... | H03M 7/40 |
| | | | | 341/67 |
| 2010/0014766 A1* | 1/2010 | Akenine-Moller | ....... | G06T 9/00 |
| | | | | 382/239 |
| 2010/0174547 A1 | 7/2010 | Vos | | |
| 2016/0314797 A1 | 10/2016 | Vasilache et al. | | |
| 2019/0121883 A1* | 4/2019 | Swaminathan | ..... | G06F 16/2365 |
| 2019/0121884 A1* | 4/2019 | Swaminathan | ..... | H03M 7/6088 |
| 2020/0142642 A1* | 5/2020 | Billa | ................ | G06F 3/0673 |

(Continued)

FOREIGN PATENT DOCUMENTS

EP    505654 A1 *  9/1992    ............. G06T 9/008

OTHER PUBLICATIONS

Jo et al., Compressed Bit vectors Based on Variable-to-Fixed Encodings, Dec. 29, 2016, The British Computer Society, pp. 761-775. (Year: 2016).*

(Continued)

*Primary Examiner* — John J Tabone, Jr.
(74) *Attorney, Agent, or Firm* — Edell, Shapiro & Finnan, LLC

(57) ABSTRACT

In some aspects, the techniques described herein relate to a method including: obtaining data to be compressed; determining a distance between the data to be compressed and each codeword of a plurality of codewords; selecting a predetermined number of codewords of the plurality of codewords based on the distance between the data to be compressed and each of the predetermined number of codewords; and generating compressed data, where the compressed data includes an indication of the predetermined number of codewords of the plurality of codewords.

20 Claims, 8 Drawing Sheets

(56) References Cited

U.S. PATENT DOCUMENTS

2020/0228148 A1* 7/2020 Thomas .............. H03M 7/6023
2020/0309976 A1 10/2020 Khan et al.
2020/0311077 A1* 10/2020 Zhang ................... G06F 3/068
2020/0394066 A1* 12/2020 Senthil Nayakam ........................
                                                       H04L 12/4625
2021/0118455 A1 4/2021 Shlomot et al.

OTHER PUBLICATIONS

Chen, Y., et al., "Approximate Nearest Neighbor Search by Residual Vector Quantization," ResarchGate, Sensors 2010, 10, 11259-11273; doi:10.3390/s101211259, Dec. 2010, https://www.researchgate.netpublication/51873001_Approximate_Nearest_Neighbor_Search_by_Residual_Vector_Quantization, 16 pages.

Jiang, X., et al., "End-to-End Neural Speech Coding for Real-Time Communications," ICASSP 2022-2022 IEEE International Conference on Acoustics, Speech and Signal Processing (ICASSP), May 23-27, 2022, https://ieeexplore.ieee.org/document/9746296, 5 pages.

Zeghidour, N., et al., "SoundStream: An End-to-End Neural Audio Codec," Google Research Blog, https://ai.googleblog.com/2021/08/soundstream-end-to-end-neural-audio.html, Aug. 12, 2021, 12 pages.

Zeghidour, N., et al., "SoundStream: An End-to-End Neural Audio Codec," ACM JournalsIEEE, ACM Transactions on Audio, Speech and Language Processing, vol. 30, Jan. 25, 2022, 6 pages.

\* cited by examiner

COMPUTATIONALLY EFFICIENT AND BITRATE SCALABLE SOFT VECTOR QUANTIZATION

TECHNICAL FIELD

The present disclosure relates to data compression.

BACKGROUND

Vector Quantization (VQ) is a widely used technique for data compression. To support high bitrates, a multi-layer form of VQ, such as residual vector quantization (RVQ), is typically utilized. In RVQ systems, a series of VQ stages or layers are used, with each subsequent layer compressing the error in the quantization performed by the previous layer. Other VQ techniques, such as product quantization (PQ), may be implemented in other compression systems. In PQ, the data being compressed is broken into subspaces, which are compressed using VQ stages.

In RVQ systems, high bitrates are achieved by adding more VQ layers or increasing the number of codewords per layer. In PQ systems, high bitrates are achieved by increasing the number of subspaces or increasing the number of codewords used in the quantization of each subspaces. In both systems there is a linear relation between bitrate and computational complexity as well as memory consumption. Accordingly, it may be difficult to scale such systems to provide increased bitrates.

DETAILED DESCRIPTION

Overview

Figure 1:
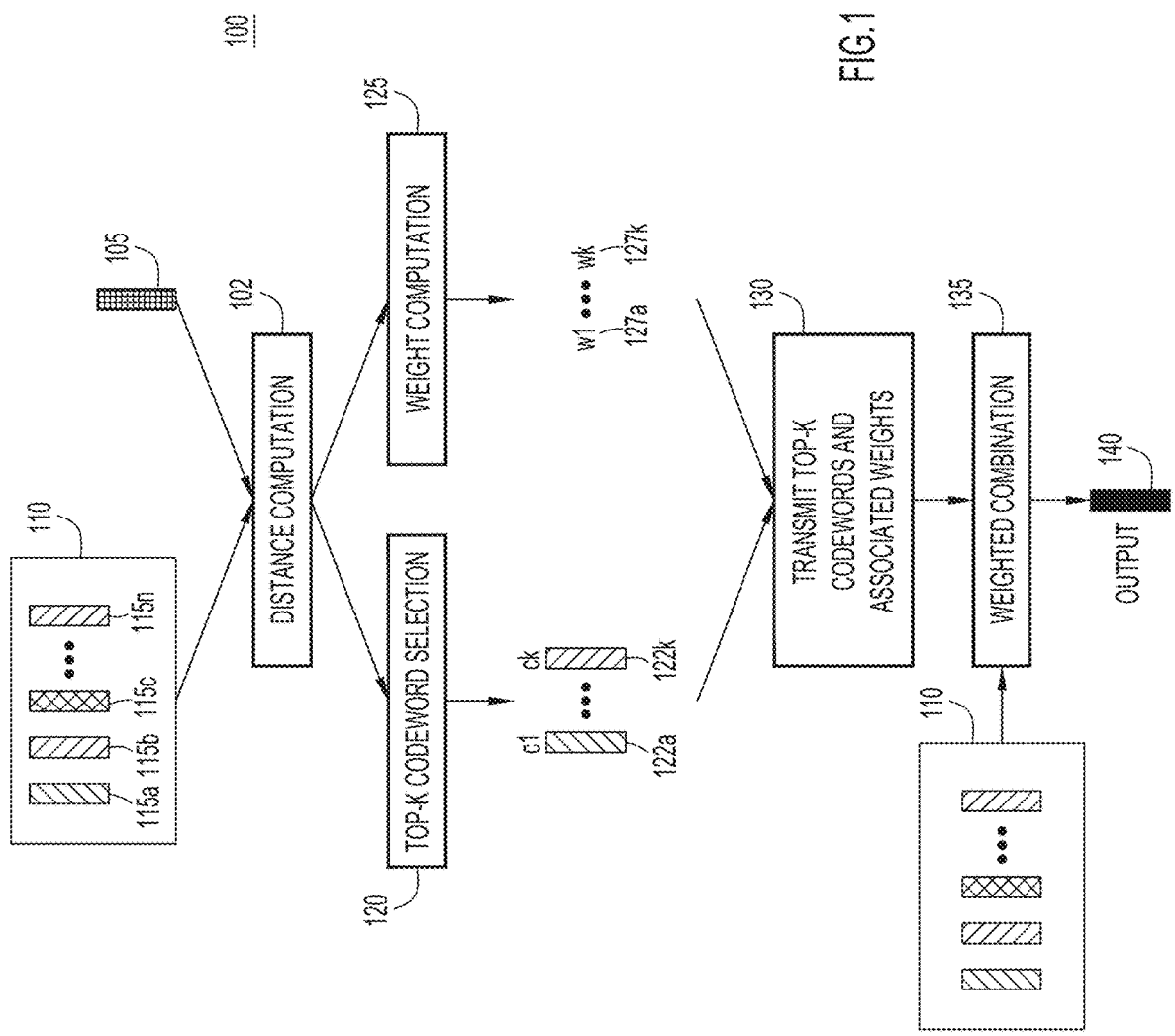
FIG. 1 is functional diagram of a system configured to implement the vector quantization (VQ) techniques of this disclosure, according to an example embodiment.

In some aspects, the techniques described herein relate to a method including: obtaining data to be compressed; determining a distance between the data to be compressed and each codeword of a plurality of codewords; selecting a predetermined number of codewords of the plurality of codewords based on the distance between the data to be compressed and each of the predetermined number of codewords; and generating compressed data, where the compressed data includes an indication of the predetermined number of codewords of the plurality of codewords.

According to other aspects, the techniques described herein relate to a method including: obtaining compressed data; determining a plurality of codewords from the compressed data; determining a weight for each of the plurality of codewords; and determining decompressed data from the plurality of codewords and the weight for each of the plurality of codewords.

According to still other aspects, the techniques described herein relate to one or more tangible, non-transitory computer readable mediums encoded with instructions, wherein the instructions, when executed by one or more processors, are operable to: obtain data to be compressed; determine a distance between the data to be compressed and each codeword of a plurality of codewords; select a predetermined number of codewords of the plurality of codewords based on the distance between the data to be compressed and each of the predetermined number of codewords; and generate compressed data, where the compressed data includes an indication of the predetermined number of codewords of the plurality of codewords.

EXAMPLE EMBODIMENTS

Related art data compression utilizing Vector Quantization (VQ) increases the bitrate of the compressed data by using additional VQ layers or increasing the size of the codebook utilized in each layer. These techniques may be difficult to scale. The present disclosure is directed to VQ techniques that use a "top-K" scoring approach that achieves higher bitrates by increasing the number of codewords associated with the compression at a VQ stage in VQ quantization, at each layer in Residual Vector Quantization (RVQ) or at each subspace in Product Quantization (PQ). For example, in a VQ stage of a VQ system, encoded data is associated with two, three or more codewords, which may be the codewords most similar to the data being encoded. In an RVQ system, the compression at one or more of the RVQ layers encodes the data using two, three or more codewords whose distances (e.g., Euclidean distance, Hamming distance, Manhattan distance, Minkowski distance, and/or scaled dot product distance) may be the lowest for the data to be encoded. By sending multiple codewords for one or more of the layers, as opposed to adding more layers or increasing codebook size, the bitrate may be increased with almost constant computational complexity. With respect to a PQ system, each subspace may be encoded using two, three or more codewords whose distances (e.g., Euclidean distance, Hamming distance, Manhattan distance, Minkowski distance, or scaled dot product distance) may be the lowest for the data to be encoded. By sending multiple codewords for one or more of the subspaces, as opposed to increasing the codebook size, the bitrate may be increased with almost constant computational complexity. For example, if the encoder output for a particular system is 512 dimensional, and there are 50 frames per second, related art techniques may achieve an increased 32 kbps bitrate by dividing the 512 dimension into 64 subspaces. However, each of these subspaces will have only 8 dimensions. Such a small number of dimensions may result in a decrease in the amount of information encoded in each subspace, decreasing the performance of the system. Using the techniques disclosed herein, the bitrate for a fixed number of subspaces may be increased by using more codewords per subspace as described herein.

The disclosed techniques may also be applied to improve the quality of data obtained from low-bitrate (LBR) forward error correction (FEC) packets in case of packet losses.

By way of background, VQ is a widely used technique for data compression, clustering, and searching for similar patterns. It is used in several well-known audio codecs and it is also a common choice in neural audio codecs. To efficiently support bitrates typically used in audio coding, multi-layer vector quantizers are employed using approaches like RVQ and PQ.

RVQ refers to a multistage vector quantization that employs a sequence of VQ stages. Each stage in the sequence encodes the residual error from the previous stage. Related art RVQ techniques provide increased bitrate by including additional VQ layers. An increase in the number of layers results in an increase in the computational complexity of the quantization. Specifically, the computational complexity in a VQ system is generally a function of the number of times a distance calculation is performed. These distance calculations determine the relative difference between the data being encoded and each of the codewords in the codebook used in the VQ stage. Each new VQ stage or layer in the RVQ system results in an additional distance calculation between the data being encoded and each codeword utilized in the codebook. Computing the distances is the main computationally heavy part of VQ encoding techniques. Specifically, the distance computations typically require a dot product between the VQ input and every codeword in a given VQ layer for common weight computations. The usual VQ implementation requires the determination of a single codeword with the minimum distant (maximum probability). Accordingly, increasing the number of VQ layers in an RVQ system linearly increases the computational complexity of the overall RVQ system.

Increasing the number of codewords used in the codebooks also linearly increases the computational complexity of an VQ system. Each VQ stage of an RVQ system determines the distance between the data being encoded and each codeword in the codebook. Increasing the number of codewords in the codebook results in a corresponding increase in the number of distance calculations in the VQ stage or layer. Accordingly, increasing the number of codewords to increase the bitrate also linearly increases the computational complexity of the overall RVQ system. For example, to support 60-bit per frame coding, one would need $2^{60}$ codewords in a single layer, and for each input vector one would compute the distance to each one of them. One example of how to prevent such prohibitive computation and memory cost would be to create a 6 layer RVQ system, with each layer having 1024 codewords leading to 10 bits per layer and 60-bit overall quantization.

PQ techniques may also experience a similar linear increase in computational complexity when codebooks used in each stage are enlarged. Where RVQ utilizes multiple VQ stages in series, PQ utilizes multiple VQ stages in parallel, with different VQ stages being used to quantized different portions of the data to be encoded. For example, if 128 bits are to be encoded, a first VQ stage may be used to encode bits 0-31, a second VQ stage may be used to encode bits 32-63, a third VQ stage may be used to encode bits 64-95, and a fourth VQ stage may be used to encode bits 96-127. When the bitrate is increased linearly by adding additional VQ stages to a PQ system by dividing the input into more and more subspaces, the computational complexity of the system does not increase as each stage uses linearly less computation due to reduced dimension. However, reducing the dimension per stage creates an information bottleneck which may degrade performance if too many subspaces are used, putting a practical limit on the bitrate achievable by increasing the number of subspaces. In such cases, increasing codebook size per stage may be used to increase bitrate, which increases the computational complexity linearly with bitrate.

The above-described linear relation between the bitrate and computational complexity in VQ, RVQ and PQ systems may become more problematic when using a learned representation employing a neural network or similar machine learning model as an encoder instead of using a fixed representation, such as short-time Fourier Transform, linear prediction coefficients (LPC) or Mel spectrogram. The encoder and the quantizer operating on the transmit side may have a fixed total computation and memory budget allocation. As bitrate is increased by increasing the number of VQ stages or layers, the computational budget for the encoder is reduced. This reduced budget may result degraded representations of the data at the encoder output, which may equate to reduced audio quality for audio data. Therefore, a VQ system that has almost constant computational complexity with respect to utilized bitrate may be beneficial.

The techniques of the present disclosure may provide for increased bitrate and/or increased audio quality using a framework where the computational complexity remains substantially constant as the bitrate is increased. To achieve substantially constant computational complexity, and therefore bitrate scalability, the hard assignment in VQ is converted to soft assignment. Instead of selecting a single codeword from the codebook to approximately represent the input vector, a weighted combination of multiple codewords is used. For example, a "Soft K-means" method may be used in selecting the plurality of codewords. Specifically, the distances to each codeword will be computed, but instead of selecting the codeword having the minimum distance, a plurality of codewords are selected based on some selection criteria that is a function of distance between codewords and the input, and a weighted combination of these codewords is calculated to approximately represent the input vector. The weights used may also be a function of the already computed distances. The disclosed techniques support the use of any distance function, codeword selection method, and/or weight determination method suitable for the application. Accordingly, Euclidean distance, Hamming distance, Manhattan distance, Minkowski distance, and/or scaled dot product techniques may be used without deviating from the disclosed techniques.

As noted above, computing the distances is the main computationally heavy part of VQ encoding. When using top-k techniques, the disclosed techniques find the next k−1 minimum distance (k−1 most probable) codewords in the codebook. If the codebook size is 1024, finding the k minimum elements is computationally much cheaper than computing the distances themselves. Accordingly, the disclosed techniques may use a priority queue for determining the k minimums, which will have linear complexity without requiring sorting.

An example system implementing the disclosed techniques is now described with reference to system 100 of FIG. 1. As illustrated in operation 102 of FIG. 1, a VQ layer computes the distance of the input vector 105 to each codeword 115a-n in codebook 110. The distance function used in the distance computation may be Euclidean distance as is often the case in VQ systems. Other distance computations may use scaled dot product techniques, as is often the case in attention layers in Transformer networks. Other distance computations may also include Hamming distance, Manhattan distance, or Minkowski distance computations for the input vector 105 with respect to each codeword 115a-n.

The distance calculation of operation 102 may be compiled into a distance vector. The distance vector obtained may then be converted to a probability distribution over the codebook for each input vector using techniques that may include exponentiation and Softmax nonlinearity. The top scoring codewords 122a-k are selected in operation 120 and the probabilities of these codewords are normalized to sum to 1. The number of k codewords may be selected depending on the desired bitrate for the transmission of the compressed data. The normalized probabilities are the weights 127a-k determined in operation 125 and will be used in obtaining a weighted sum of the k selected codewords 122a-k.

For example, if the distance between input vector x and codeword $c_i$ is denoted as $d(x, c_i)$, the probability of codeword $c_i$ being selected is denoted by pi, and may be computed as:

$$p_i = \frac{e^{-\beta d(x,c_i)}}{\sum_{j=1}^{n} e^{-\beta d(x,c_j)}}, i = 1 \ldots n;$$

where β is a scalar for the predetermined temperature parameter to decide on sparsity of the probability distribution. Once the top-k codewords which have the highest probabilities are selected, the normalized weights $w_1 \ldots w_k$ may be computed as follows:

$$w_i = \frac{p_i}{\sum_{j=1}^{K} p_j}, i = 1 \ldots k,$$

so that they sum to 1 for each input vector x.

The above description for determining the top codewords in operation 120 and their associated weights in operation 125 is just one example process for determining the codewords 122a-k and associated weights 127a-k.

The indices of the codewords 122a-k within codebook 110 along with their respective normalized probabilities or weights 127a-k may be transmitted to a receiver on a receive side in operation 130. The normalized probabilities or weights 127a-k may be quantized for transmission using scalar quantization and entropy coding. In certain example embodiments, only k-1 of the weights 127a-k are quantized and transmitted as the last of the weights may be determined on the receive side knowing the constraint that the weights 127a-k sum to 1. For example, if weights 127a through 127k-1 add up to "0.9," it may be determined on the receive side that weight 127k has the value of "0.1." Accordingly, weight 127k would not need to be sent, thereby conserving bandwidth. Additionally, in embodiments utilizing a neural audio codec, the neural network may learn to use almost constant weights for each of the weights 127a-k, which would eliminate the need to transmit any of the weights 127a-k to the receive side.

Upon receipt at the receive side, the codewords 122a-k are determined from the received indices and a version of codebook 110 contained or stored at the receive side. Using codewords 122a-k and the weights 127a-k, a weighted combination calculation 135 is performed that generates data 140.

The codeword selection techniques described above may be applied to VQ systems with a single VQ stage, and in such examples, the VQ implementation of the disclosed techniques may be similar to operations 102, 120 and 125 of FIG. 1. The number of codewords used in the single layer may be determined based upon the desired bitrate. The disclosed techniques may also be combined with other types of VQ systems without deviating from the inventive concepts. For example, the disclosed techniques may be implemented in systems in which a different codec-quantizer-decoder combination is used for each supported bitrate. According to other examples, the disclosed techniques may be implemented in systems in which the same encoder and decoder are used for each supported bitrate, but with separate multi-layer VQ stages and associated input/output projections for every supported bitrate. According to still other examples, the disclosed techniques may be implemented in systems in which the length of the codewords used in the plurality of codewords may be decreased as the desired bitrate is increased.

The discussion above has used audio data and audio codes as an example, with neural audio codecs as a specific example. However, the techniques presented herein are not limited to audio data, audio codecs, and/or neural audio codecs. Instead, the disclosed techniques may be implemented in any system utilizing VQ and its multi-layer variants such as RVQ or PQ. Accordingly, an RVQ implementation of the disclosed techniques will now be described with reference to FIG. 2.

Figure 2:
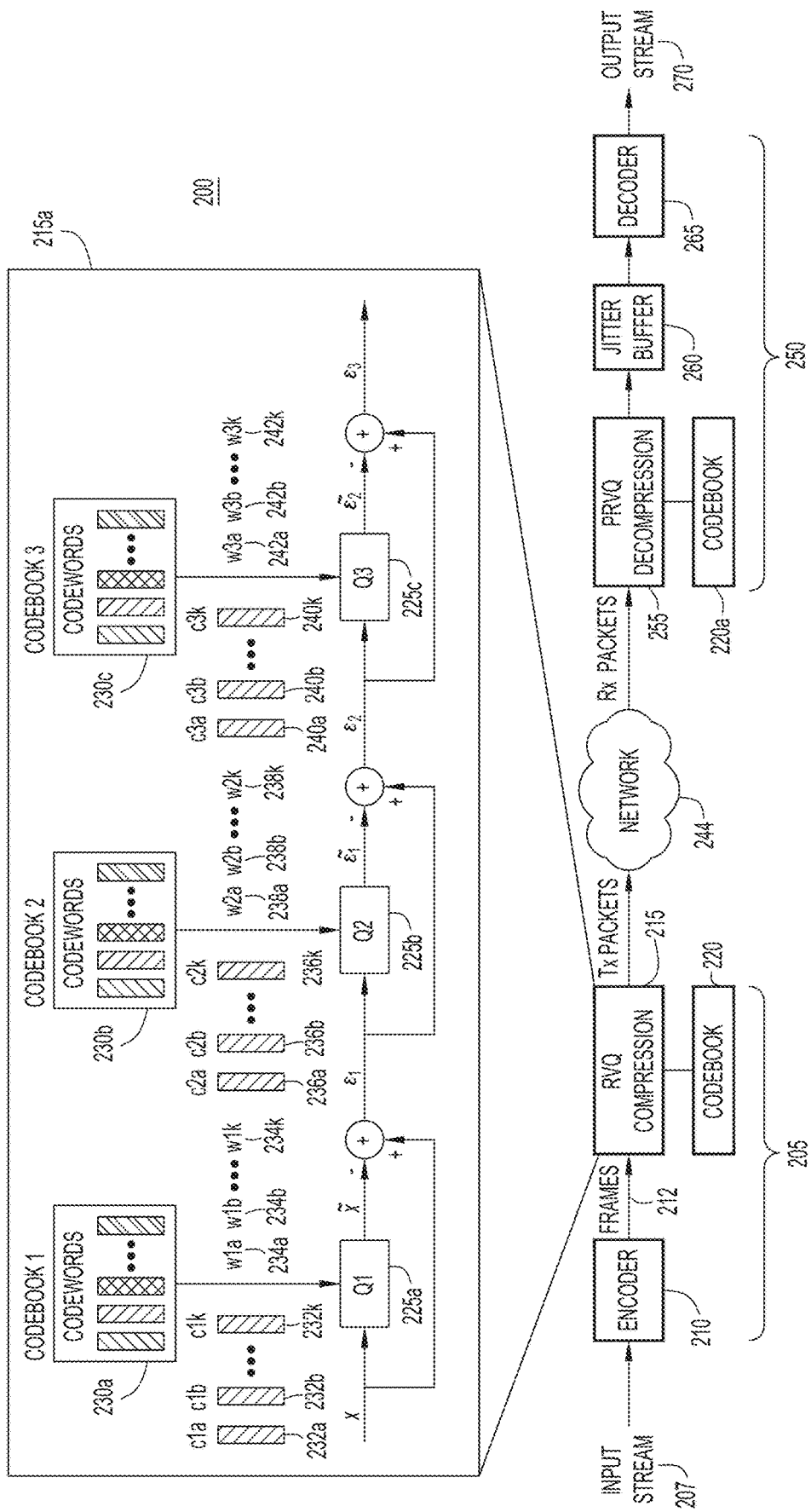
FIG. 2 is functional diagram of a system configured to implement the VQ techniques of this disclosure in a Residual Vector Quantization (RVQ) system, according to an example embodiment.

Depicted in FIG. 2 is a system 200 configured to provide RVQ using the techniques of this disclosure. System 200 includes a transmit side 205 and a receive side 250. The transmit side 205 includes an encoder 210, an RVQ compression block 215, and codebook 220. Similar to related art RVQ techniques, encoder 210 receives input stream 207, which is embodied as an audio stream in the current implementation, and utilizes a codec to convert the analog audio signals of audio stream 207 into encoded data frames 212. The encoded data frames 212 are compressed by RVQ compression block 215 using the scalable soft vector quantization techniques of this disclosure.

As illustrated in detailed view 215a, RVQ compression block 215 includes three quantization layers—quantization layer 225a, quantization layer 225b, and quantization layer 225c—each of which has a corresponding codebook—codebooks 230a, 230b and 230c respectively. Depending on the specific implementation, codebooks 230a, 230b and 230c may contain the same or different codewords and/or a same or different number of codewords. Quantization layer 225a receives an encoded audio frame and quantizes it using codebook 230a. The error in this quantization is passed to quantization layer 225b, which uses codebook 230b to quantize the error in the quantization provided by quantization layer 225a. The error in the quantization provided by quantization layer 225b is passed to quantization layer 225c, which uses codebook 230c to quantize its received error. While system 200 includes three quantization layers, the skilled artisan will understand that the number of layers in the system may be determined by the requirements for system 200, such as the lowest bitrate to be supported and/or the codebook size per layer.

As illustrated in system 200, each quantization layer 225a-c generates a plurality of codewords through the scalable soft vector quantization techniques described above with reference to FIG. 1. Accordingly, quantization layer 225a generates codewords 232a-k with accompanying weights 234a-k. The error in this quantization is quantized by quantization layer 225b, resulting in codewords 236a-k and weights 238a-k. Finally, the error in the quantization provided by quantization layer 225b is quantized by quantization layer 225c, resulting in codewords 240a-k and associated weights 242a-k. The additional complexity of finding the top-k codewords instead of the top-1 codeword is usually negligible compared to distance calculations between the codewords and the input vector for typical values of codeword size and input vector dimension. Accordingly, the bitrate of data provided by RVQ compression block 215 may be increased compared to related art techniques without substantially increasing the computation and memory costs associated with the quantization.

Furthermore, the number of quantization layers 225a-c may be fixed at 3. However, this does not mean that the bitrate of audio data encoded and transmitted by transmit side 205 must remain fixed. Instead, higher bitrates may be achieved by increasing the number of codewords used in the quantization provided by one or more of quantization layers 225a-c. For example, if the number of selected code words in quantization layer 225a is increased from 3 to 4 (i.e., k is increased from 3 to 4), the bitrate of the data encoded by quantization layer 225a also increases. However, because the size of codebook 230a may remain constant, as does the number of distance calculations performed by quantization layer 225a, the memory consumption and computation requirements for quantization layer 225a remains substantially constant with respect to bitrate.

System 200 may combine the scalable soft vector quantization techniques described herein with other techniques to further increase bitrate of the output transmitted from transmit side 205. For example, if memory consumption is not a concern, a different set of VQ codewords (i.e., a different codebook) per bitrate (per value of k in top-k selection) may be used for improved performance.

Once the data is compressed via RVQ compression block 215, the data is transmitted over network 244 to receive side 250. The transmitted data may include the indices of codewords 232a-k, 236a-k and 240a-k. The transmitted data may also include the weights 234a-k, 236a-k and 242a-k. However, when the weights are normalized to 1, as described above with reference to FIG. 1, only k−1 weights may be transmitted to receive side 250. According to examples in which weights 234a-k, 238a-k and 242a-k are assigned the same value by RVQ compression block 215 for every encoded audio frame 212, the transmission of the weights may be omitted.

Once received at receive side 250, RVQ decompression block 255 will decompress the data using codebook 220a, which is a receive side version of codebook 220 of transmit side 205. Specifically, codebook 220 may include codebooks 230a, 230b and 230c utilized in the different quantization layers 225a-c of RVQ compression block 215. Accordingly, RVQ decompression block 255 will use the codeword indices received in the transmitted data to determine the codewords 232a-k, 236a-k and 240a-k used in the compression provided by RVQ compression block 215. Once codewords 232a-k, 236a-k and 240a-k are determined, RVQ decompression block will use weights 234a-k, 238a-k and 242a-k to output decompressed encoded data using a weighted combination method as described above with reference to FIG. 1. The decompressed encoded data is provided to jitter buffer 260, which collects encoded data so that it can be processed evenly by decoder 265. Finally, the decompressed data is decoded at decoder 265 and provided as an analog output stream 270.

Figure 3:
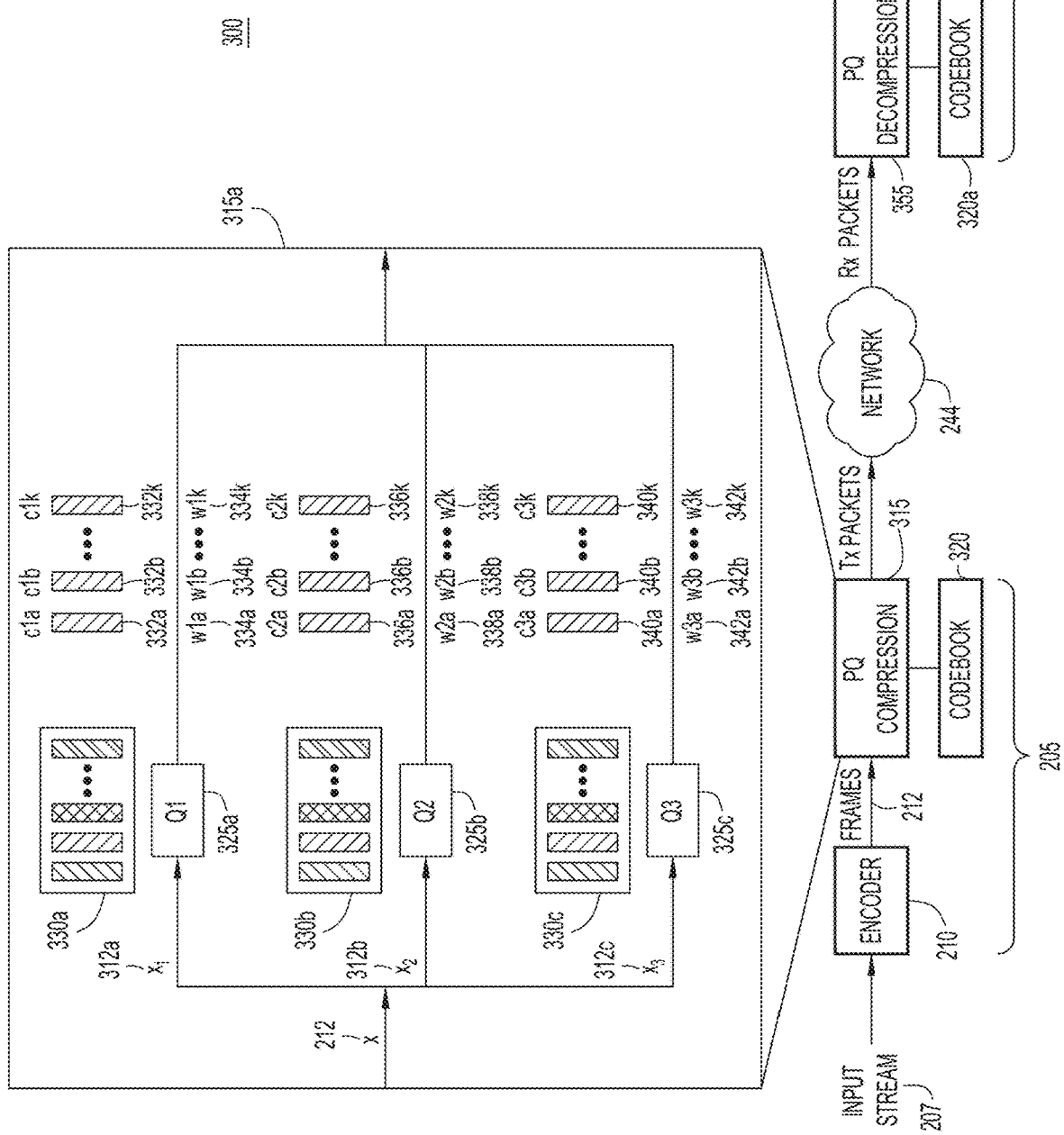
FIG. 3 is functional diagram of a system configured to implement the VQ techniques of this disclosure in a Product Quantization (PQ) system, according to an example embodiment.

With reference now made to FIG. 3, depicted there in a system 300 configured to provide PQ using the techniques of this disclosure. System 300 is similar to system 200 of FIG. 2 as it includes a transmit side 205 that receives an input stream 207, and an encoder 210. It also includes a receive side 250 that includes a jitter buffer 260 and a decoder 265 that provide an output stream 270. As these elements of system 300 are similar in operation to the corresponding elements in system 200 of FIG. 2, these elements have been provided with like reference numbers in both figures. Where system 300 differs from system 200 is in PQ compression block 315, codebook 320, PQ decompression block 355 and codebook 320a. Specifically, these elements of system 300 are configured to provide PQ as opposed to the RVQ of system 200. Accordingly, detail 315a of PQ compression block 315 illustrates quantization stages 325a-c arranged in parallel where RVQ compression block 215 of FIG. 2 has quantization layers 225a-c arranged in series.

As discussed above, PQ utilizes multiple VQ stages in parallel, with different VQ stages being used to quantize different portions of the data to be encoded. Accordingly, encoded data frame 212 is separated by PQ compression block into sub-frames 312a-c. Each of these sub-frames 312a-c is directed to a respective quantization stage 325a-c. Quantization stages 325a-c are configured to implement the scalable soft vector quantization techniques of this disclosure. Accordingly, codebook 330a is used by quantization stage 325a to quantize sub-frame 312a using a distance computation as described above with reference to FIG. 1. Similarly, quantization stage 325a selects k codewords 332a-k and corresponding weights 334a-k using the codeword selection and weight computation techniques described above with reference to FIG. 1. Quantization stages 325b and 325c provide similar quantization for sub-frames 312b and 312c using codebooks 330b and 330c, respectively, resulting in the selection of codewords 336a-k and weights 338a-k for sub-frame 312b and codewords 340a-k and weights 342a-k for sub-frame 312c.

The indices of codewords 332a-k are then transmitted to receive side for decoding. Depending on the implementation, all of weights 334a-k may be sent to receive side 250, k−1 number of weights may be sent to receive side 250 if the weights are normalized to 1, or none of weights 334a-k may be sent to the receive side 250 in embodiments where the codec used by quantization stage 325a selects codewords 332a-k with equal or pre-known weights. The indices of codewords 336a-k and codewords 340a-k will also be transmitted to receive side 250 for the decoding of sub-frames 312b and 312c, respectively. Similarly, all of weights 338a-k, k−1 number of weights 338a-k, or none of weights 338a-k may be transmitted to receive side 250. Similar transmission of weights 342a-k may also take place.

The techniques of the present disclosure may also be applied to the transmission of Forward Error Correction (FEC) data, as will now be described with reference to FIGS. 4 and 5.

A common approach used to add resilience against packet losses is in-band FEC that provides redundant information in subsequent packets for previous packets. In this approach, LBR versions of the data from several previous packets are added to the current packet. In the case of a packet loss or delay, the jitter buffer may wait for subsequent packets to arrive and use the LBR versions of the data in the next correctly transmitted packets in place of the lost packet. As illustrated in FIG. 4, data frames 405a-f contain current frame data portions 410a-f and FEC portions 415a-f, 420a-f, 425a-f, 430a-f and 435a-f. For example, in data frame 405a, the data for the present frame is contained in data portion 410a, while FEC LBR data contained in data portions 415a-430a provides resilience for data sent in previous frames.

The techniques of this disclosure may be used to further improve the quality of the output audio generated from LBR FEC frames. In the example of FIG. 4, the data portion 410a of data frame 405a includes the indices for five codewords 440a-e determined by codeword selection operation 442, and while not illustrated, may contain all of the associated weights for the codewords, 4 weights if the weights are normalized to 1, or no weights if the weight values will be known by the receive side ahead of time. FEC portions 415a, 420a, 425a and 430a contain FEC data for one or more previous data frames.

The next data frame 405b contains its own data in data portion 410b, while FEC portion 415b contains the index for codeword 440a. FEC portions 420b, 425b, 430b and 435b contain FEC data for previous frames, i.e., data frames sent prior to data frame 405a. The following data frame 405c contains its own data in data portion 410c, FEC data for data frame 405b in FEC portion 415c, the index for codeword 440b (and the associated weight if necessary) in FEC portion 420c, and FEC data for previous data frames in FEC portions 425c, 430c and 435c. Similarly, data frames 405d-405f contain the indices for codewords 440c-440e (and their associated weights if necessary) in FEC portions 425d, 430e and 435f, respectively. Accordingly, upon receipt of data frames 405b-f at a receive side, such as receive side 250 of FIG. 2 or 3, the data contained in data portion 410a of data frame 405a may be completely reconstructed even if data frame 405a is never received at the receive side.

Figure 4:
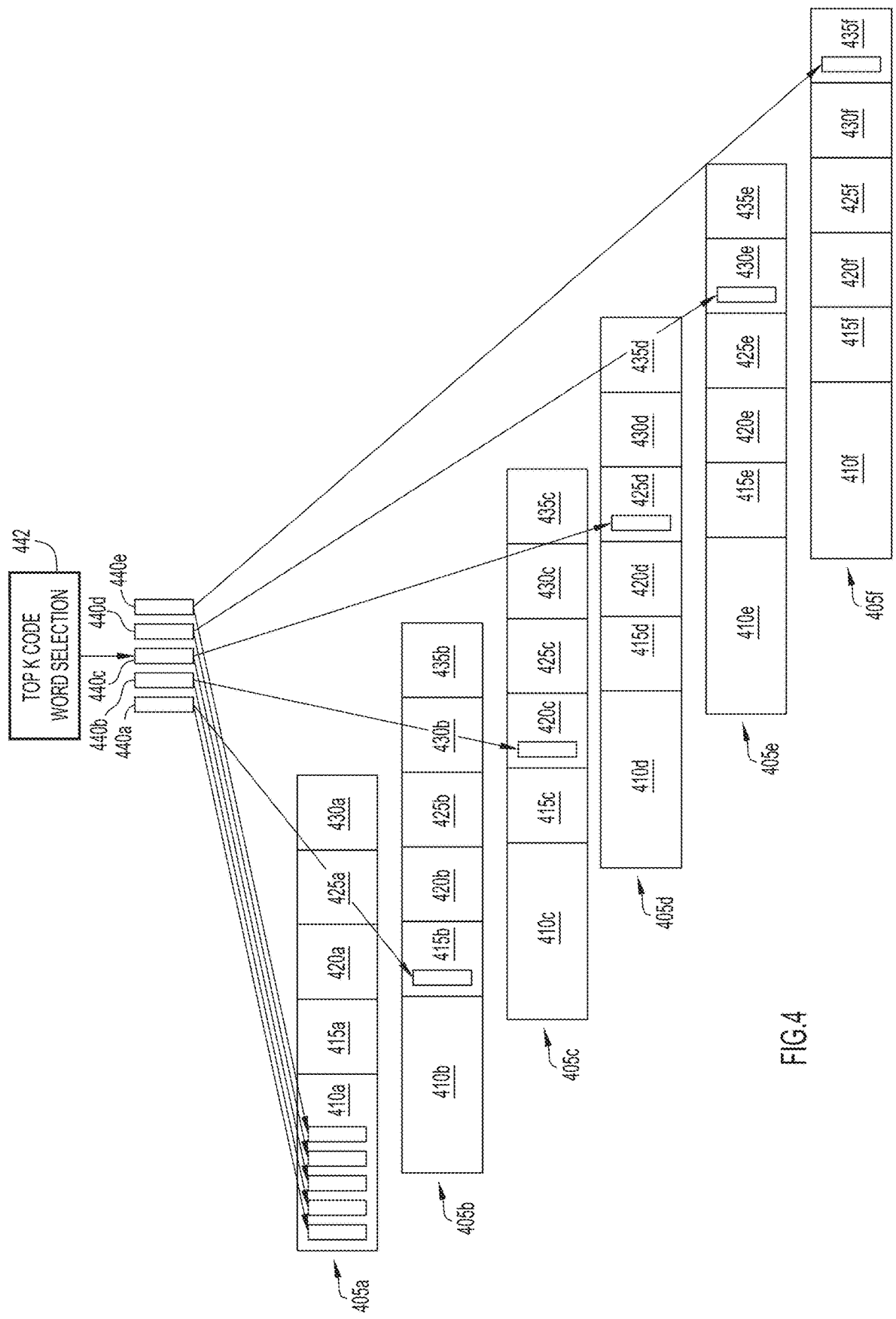
FIG. 4 illustrates a first series of data frames providing forward error correction (FEC) data generated using the VQ techniques of this disclosure, according to an example embodiment.

In other words, FIG. 4 illustrates a technique in which instead of always sending the same version of the data in the LBR FEC data portions, the disclosed techniques utilize different codewords in each LBR FEC data portion to increase the overall bitrate of the FEC frames on the decoder side.

According to another example, fewer than all five codewords may be sent in the LBR FEC data portions. For example, if five codewords are used per layer when quantizing the current frame, LBR FEC data may be included in only two of the subsequent frames. Assuming the closest five codewords are used for the current frame, the single codeword for the first LBR FEC data portion would be closest codeword, and the codeword sent in the second LBR FEC data portion would be the second closest codeword. Accordingly, if the initial data frame that includes the five codewords is lost, the receive side jitter buffer may wait for the next 2 packets, thereby obtaining the closest and the second closest codewords to the lost packet. Even though fewer than all five of the codewords are received, the two closest codewords may be sufficient for the receive side to reconstruct the data with sufficient, if decreased, fidelity.

In other examples, the five codewords from the initial frame may be spread across fewer than five subsequent frames. For example, the frame immediately following the initial frame may include three codewords in its LBR FEC data portion, and the next frame may include two codewords in its LBR FEC data portion. Accordingly, a receive-side jitter buffer would only have to wait on the next two data frames to be able to completely reconstruct a lost or delayed frame.

Figure 5:
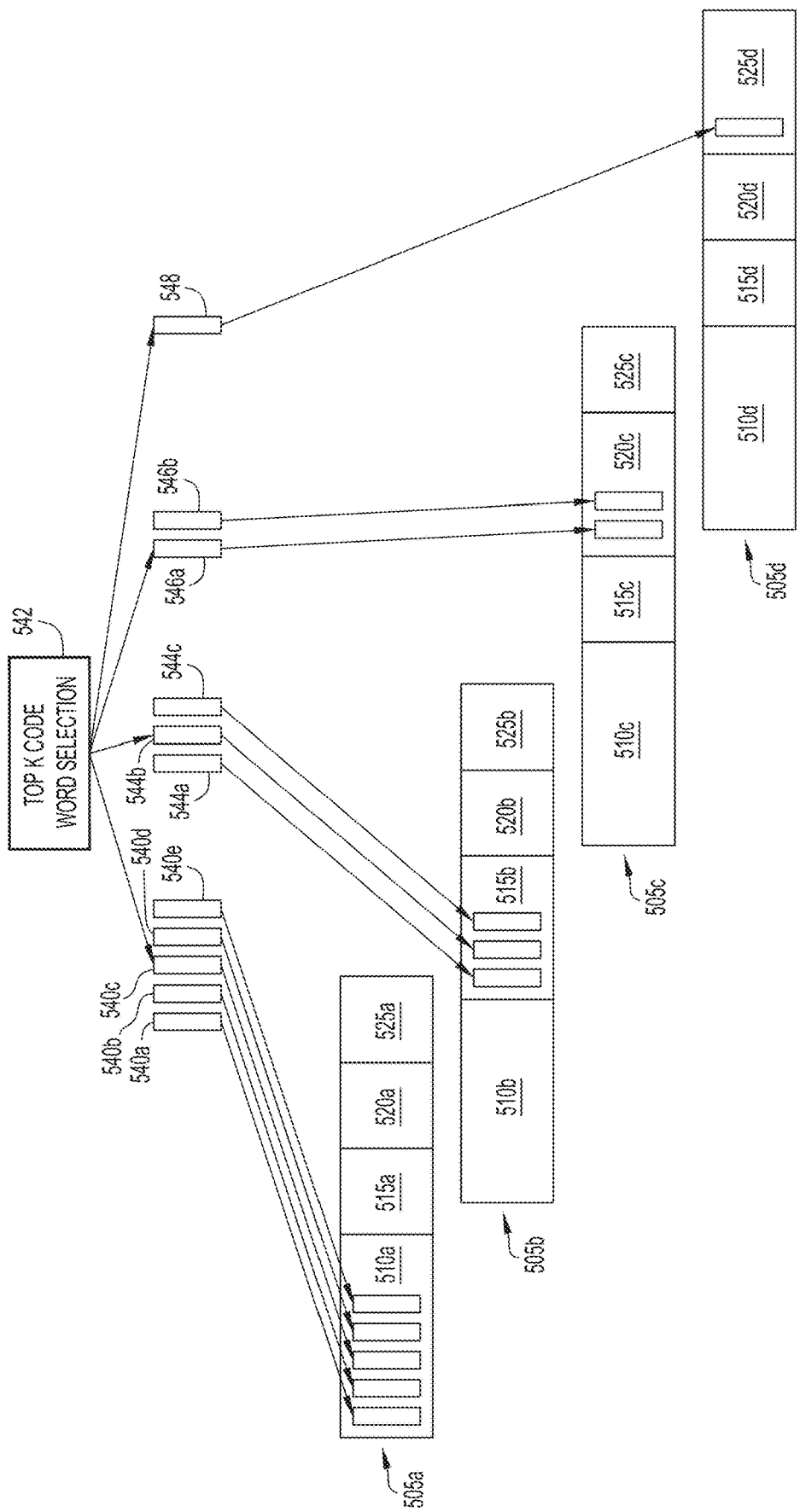
FIG. 5 illustrates a second series of data frames providing FEC data generated using the VQ techniques of this disclosure, according to an example embodiment.

With reference now made to FIG. 5, depicted therein is another example of how the techniques disclosed herein may be applied to LBR FEC data. Similar to data frames 405a-f of FIG. 4, data frames 505a-d include current frame data portions 510a-d and FEC portions 515a-d, 520a-d, and 525a-d, respectively. However, unlike codeword selection operation 442 described above with reference to FIG. 4 in which codeword selection operation 442 is performed once with respect to the data being encoded, codeword selection operation 542 of FIG. 5 is performed multiple times to provide FEC data with different codewords in data frames 505b-d. More specifically, the FEC data in frames 505b-d encodes the data transmitted in data frame 505a with a smaller number of codewords to provide FEC data of decreasing bitrate in each of data frames 505b-d.

As illustrated in data portion 510a of data frame 505a, the audio data associated with this data frame is transmitted by including the indices for codewords 540a-e (and the associated weights if necessary). Subsequent frames 505b-d include LBR FEC data in FEC portions 515b, 520c and 525d, respectively. According to this specific example, the LBR FEC data included in data frames 505b-d is acquired from additional codeword selection operations different from those that generate codewords 540a-e, but that are configured to generate data with a lower bitrate. For example, codeword selection operation 542 generates codewords 544a-c, whose indices are transmitted as LBR FEC data in FEC portion 515b of data frame 505b. Because there are three codewords 544a-c, as opposed to the five of codewords 540a-e, FEC portion 515b of data frame 505b transmits the data at a lower bitrate than data portion 510a of data frame 505a. Similarly, codeword selection operation 542 generates codewords 546a and 546b for inclusion in FEC portion 520c of data frame 505c. The two indices for codewords 546a and 546b included in FEC portion 520c transmits the data at a lower bitrate than both of data portions 510a and FEC portion 515b. Finally, codeword selection operation 542 generates codeword 548 for inclusion in FEC portion 525d of data frame 505d. The index for codeword 548 included in FEC portion 525d transmits the data at a lower bitrate than all of data portions 510a and FEC portions 515b and 520c.

According to another specific example, instead of using additional codewords, data frames 505a-d are sent with subsets of codewords 540a-e. For example, data frame 505a includes the indices for all of codewords 540a-e, data frame 505b includes the indices for codewords 540a-c, data frame 505c includes the indices for codewords 540a and 540b, and data frame 505d includes the index for codeword 540a.

Figure 6:
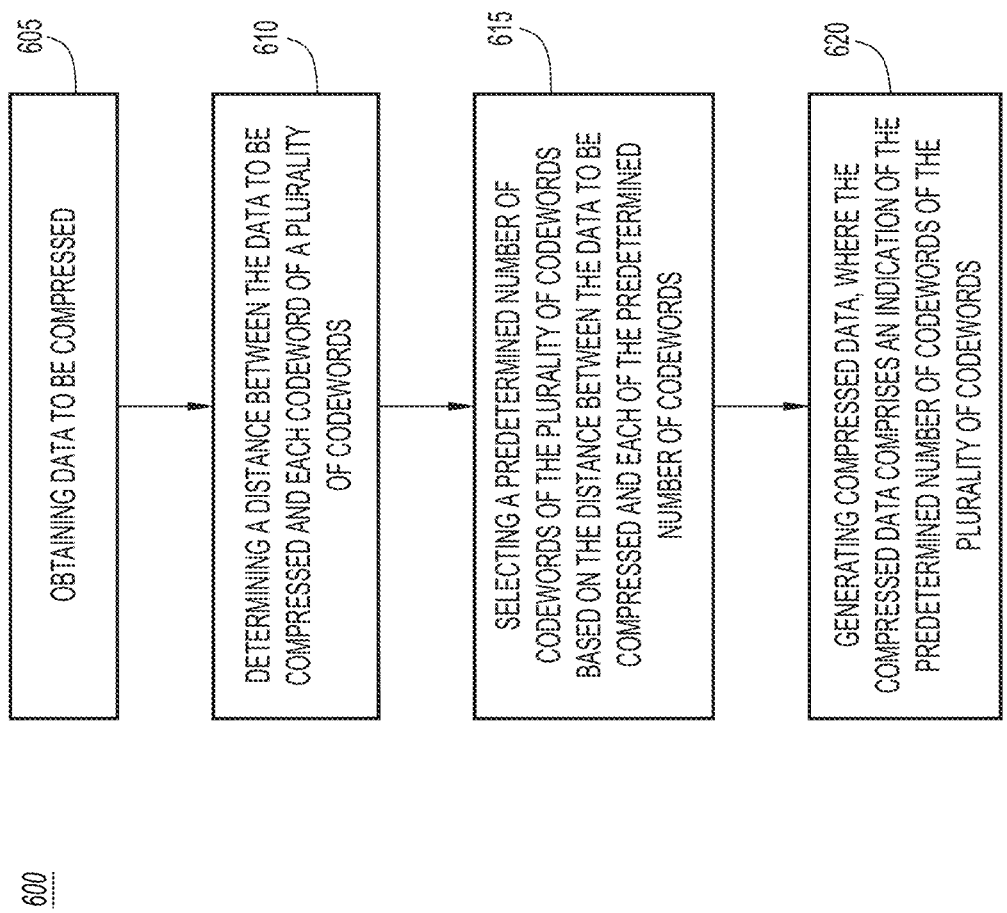
FIG. 6 is a flowchart illustrating a process flow for implementing the VQ techniques of this disclosure to generate compressed data, according to an example embodiment.

With reference now made to FIG. 6, depicted therein is a flowchart 600 providing a generalized process flow configured to implement the disclosed techniques, and in particular, the above described techniques for compressing and/or quantizing data. For example, flowchart 600 may provide a process implemented by system 100 of FIG. 1 or transmit side 205 of FIGS. 2 and 3 above.

Flowchart 600 begins in operation 605 in which data to be compressed is obtained. This data to be compressed may be embodied as audio data, video data, or any other data that may be compressed using the quantization techniques described herein. Additionally, the data to be compressed may be embodied as data to be compressed via a single vector quantization layer, data to be compressed by RVQ techniques, or data to be compressed by PQ techniques. When the data to be compressed is to be compressed using RVQ techniques, the data may be the initial data to be compressed in the first layer of the RVQ compression, or residual data to be compressed in a second or other subsequent compression layer. When the data to be compressed is to be compressed using PQ techniques, the data to be compressed of operation 605 may be the entire data vector to be compressed or one or more subspaces to be compressed via different PQ stages.

Flowchart 600 continues in operation 610 where a distance is determined between the data to be compressed and each codeword of a plurality of codewords. For example, operation 610 may be embodied as a distance comparison performed against a codebook in VQ techniques, the distance comparison against a codebook in any layer of RVQ techniques, or the comparison performed in any VQ stage of PQ techniques.

Flowchart 600 continues in operation 615 where a predetermined number of codewords of the plurality of codewords are selected based on the distance between the data to be compressed and each of the predetermined number of codewords. For example, the predetermined number of codewords may be selected because they are the codewords whose distances to the data to be compressed is the smallest. According to other examples, the predetermined number of codewords may be selected because they best represent different attributes of the audio frame content such as phonetic content, prosody, timbre, speaker characteristics, or other characteristics known to the skilled artisan. These audio attributes may be disentangled either at the output of the encoder or within the codebook.

Finally, in operation 620, the compressed data is generated. Specifically, the compressed data includes an indication of the predetermined number of codewords of the plurality of codewords. For example, the compressed data may be embodied as indices of the predetermined codewords in a codebook stored at the receive side, such codebooks 220a and 320a of receive sides 250 of FIGS. 2 and 3, respectively.

As described above with reference to FIGS. 1-3, operation 620 may also include the determination of weights for each of the predetermined codewords. These weights may be normalized to 1. As also noted above, if a codec is used to implement flowchart 600, and the codec is trained such that each codeword is selected with the same weight, the determination of the weights may be omitted in the process flow without deviating from the techniques disclosed herein.

Figure 7:
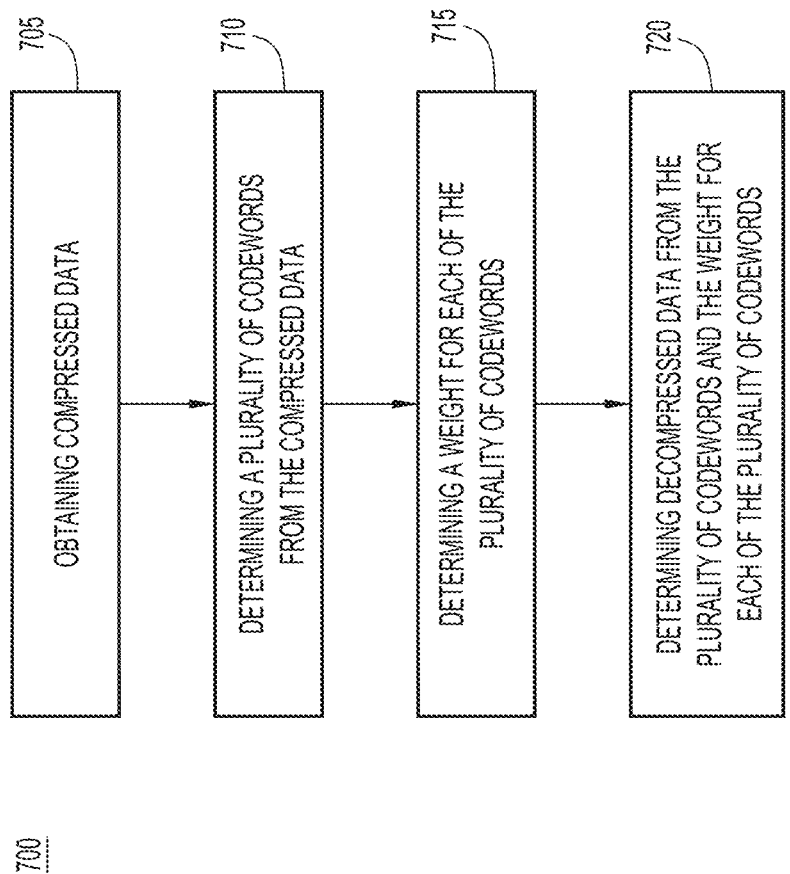
FIG. 7 is a flowchart illustrating a process flow for implementing the VQ techniques of this disclosure to generate decompressed data, according to an example embodiment.

With reference now made to FIG. 7, depicted therein is a flowchart 700 providing a generalized process flow configured to implement the disclosed techniques, and in particular, the above described techniques for decompressing and/or dequantizing data. For example, flowchart 700 may provide a process implemented by receive side 250 of FIGS. 2 and 3 above.

Flowchart 700 begins in operation 705 where compressed data is obtained. The compressed data may be obtained from a single layer VQ compression system, an RVQ compression system as illustrated in FIG. 2 or a PQ compression system as illustrated in FIG. 3. Additionally, the compressed data received in operation 705 may refer to the receipt of a single data frame, like those illustrated in FIGS. 4 and 5.

In operation 710, a plurality of codewords are determined from the compressed data. For example, if the compressed data contains indices for codewords contained in a codebook of a receive side, such as receive side 250 of FIGS. 2 and 3, the indices may be used to look up the corresponding codewords in the codebook.

Flowchart 700 continues in operation 715 where a weight is determined for each of the plurality of codewords. Depending on the implementation of the disclosed techniques, the weights for all of the codewords may be included in the compressed data. According to other implementations, specifically implementations in which the weights are normalized to 1, all but one of the weights may be included in the compressed data with the last weight being determined from the other weights. According to still other implementations, the codec used to provide the compressed data may select codewords with the same or another set of predetermined weights. According to these implementations, all of the weights may be omitted from the compressed data, with the codec being used to determine the weights for the plurality of codewords. Finally, decompressed data is determined from the plurality of codewords and the weight for each of the plurality of codewords in operation 720.

Figure 8:
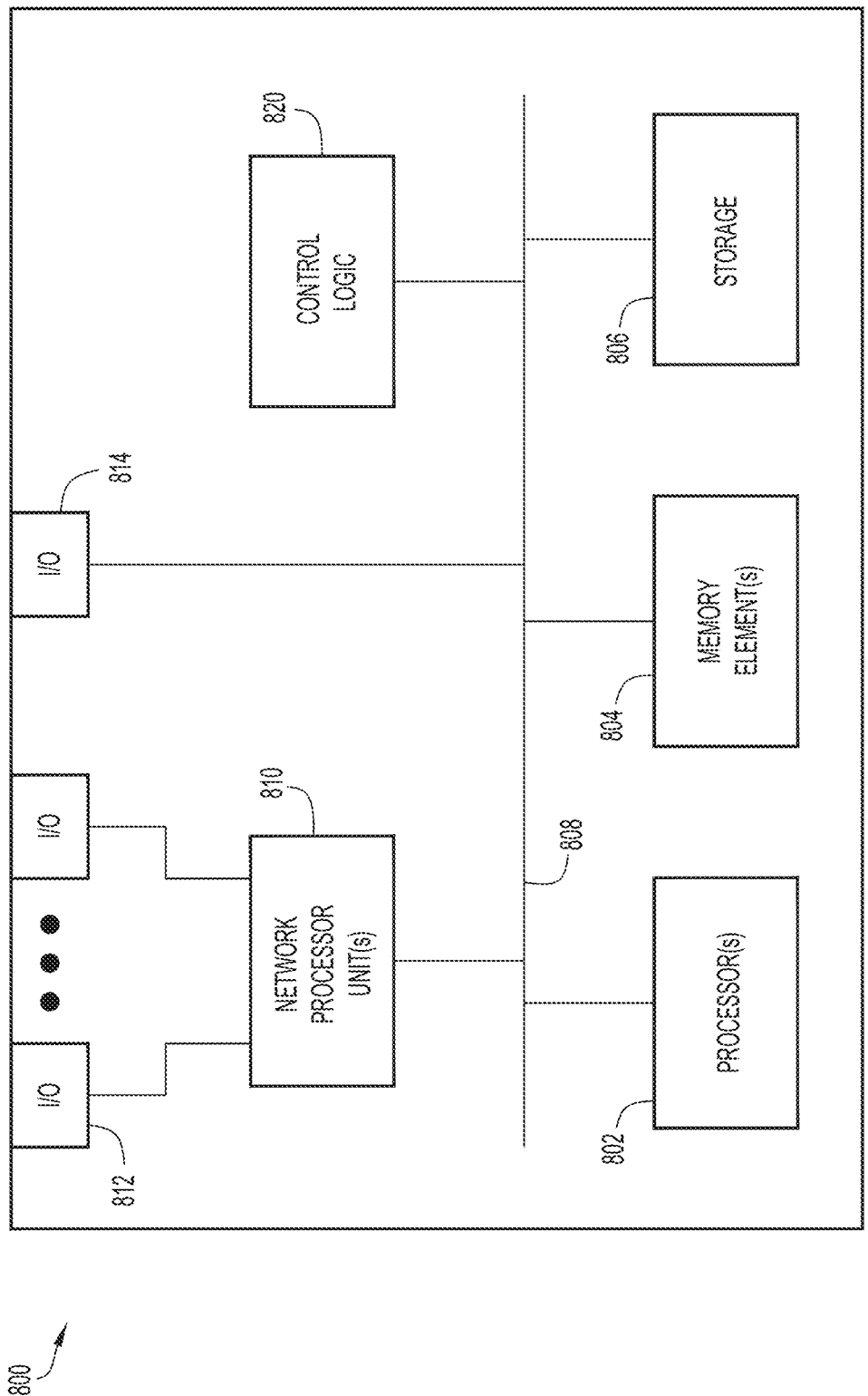
FIG. 8 is a functional block diagram of a processing device configured to implement the VQ techniques of this disclosure, according to an example embodiment.

Referring to FIG. 8, FIG. 8 illustrates a hardware block diagram of a computing device 800 that may perform functions associated with operations discussed herein in connection with the techniques depicted in FIGS. 1-7. In various embodiments, a computing device or apparatus, such as computing device 800 or any combination of computing devices 800, may be configured as any entity/entities as discussed for the techniques depicted in connection with FIGS. 1-7 in order to perform operations of the various techniques discussed herein.

In at least one embodiment, the computing device 800 may be any apparatus that may include one or more processor(s) 802, one or more memory element(s) 804, storage 806, a bus 808, one or more network processor unit(s) 810 interconnected with one or more network input/output (I/O) interface(s) 812, one or more I/O interface(s) 814, and control logic 820. In various embodiments, instructions associated with logic for computing device 800 can overlap in any manner and are not limited to the specific allocation of instructions and/or operations described herein.

In at least one embodiment, processor(s) 802 is/are at least one hardware processor configured to execute various tasks, operations and/or functions for computing device 800 as described herein according to software and/or instructions configured for computing device 800. Processor(s) 802 (e.g., a hardware processor) can execute any type of instructions associated with data to achieve the operations detailed herein. In one example, processor(s) 802 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, memory element(s) 804 and/or storage 806 is/are configured to store data, information, software, and/or instructions associated with computing device 800, and/or logic configured for memory element(s) 804 and/or storage 806. For example, any logic described herein (e.g., control logic 820) can, in various embodiments, be stored for computing device 800 using any combination of memory element(s) 804 and/or storage 806. Note that in some embodiments, storage 806 can be consolidated with memory element(s) 804 (or vice versa), or can overlap/exist in any other suitable manner.

In at least one embodiment, bus 808 can be configured as an interface that enables one or more elements of computing device 800 to communicate in order to exchange information and/or data. Bus 808 can be implemented with any architecture designed for passing control, data and/or information between processors, memory elements/storage, peripheral devices, and/or any other hardware and/or software components that may be configured for computing device 800. In at least one embodiment, bus 808 may be implemented as a fast kernel-hosted interconnect, potentially using shared memory between processes (e.g., logic), which can enable efficient communication paths between the processes.

In various embodiments, network processor unit(s) 810 may enable communication between computing device 800 and other systems, entities, etc., via network I/O interface(s) 812 (wired and/or wireless) to facilitate operations discussed for various embodiments described herein. In various embodiments, network processor unit(s) 810 can be configured as a combination of hardware and/or software, such as one or more Ethernet driver(s) and/or controller(s) or interface cards, Fibre Channel (e.g., optical) driver(s) and/or controller(s), wireless receivers/transmitters/transceivers, baseband processor(s)/modem(s), and/or other similar network interface driver(s) and/or controller(s) now known or hereafter developed to enable communications between computing device 800 and other systems, entities, etc. to facilitate operations for various embodiments described herein. In various embodiments, network I/O interface(s) 812 can be configured as one or more Ethernet port(s), Fibre Channel ports, any other I/O port(s), and/or antenna(s)/antenna array(s) now known or hereafter developed. Thus, the network processor unit(s) 810 and/or network I/O interface(s) 812 may include suitable interfaces for receiving, transmitting, and/or otherwise communicating data and/or information in a network environment.

I/O interface(s) 814 allow for input and output of data and/or information with other entities that may be connected to computing device 800. For example, I/O interface(s) 814 may provide a connection to external devices such as a keyboard, keypad, a touch screen, and/or any other suitable input and/or output device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, control logic 820 can include instructions that, when executed, cause processor(s) 802 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein (e.g., control logic 820) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, any entity or apparatus as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, memory element(s) 804 and/or storage 806 can store data, software, code, instructions (e.g., processor instructions), logic, parameters, combinations thereof, and/or the like used for operations described herein. This includes memory element(s) 804 and/or storage 806 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IOT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™, mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

In various example implementations, any entity or apparatus for various embodiments described herein can encompass network elements (which can include virtualized network elements, functions, etc.) such as, for example, network appliances, forwarders, routers, servers, switches, gateways, bridges, loadbalancers, firewalls, processors, modules, radio receivers/transmitters, or any other suitable device, component, element, or object operable to exchange information that facilitates or otherwise helps to facilitate various operations in a network environment as described for various embodiments herein. Note that with the examples provided herein, interaction may be described in terms of one, two, three, or four entities. However, this has been done for purposes of clarity, simplicity and example only. The examples provided should not limit the scope or inhibit the broad teachings of systems, networks, etc. described herein as potentially applied to a myriad of other architectures.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of can be represented using the'(s)' nomenclature (e.g., one or more element(s)).

In summary and in some aspects, the techniques described herein relate to a method including: obtaining data to be compressed; determining a distance between the data to be compressed and each codeword of a plurality of codewords; selecting a predetermined number of codewords of the plurality of codewords based on the distance between the data to be compressed and each of the predetermined number of codewords; and generating compressed data, where the compressed data includes an indication of the predetermined number of codewords of the plurality of codewords.

In some aspects, the techniques described herein relate to a method, wherein generating the compressed data further includes determining a weight associated with each of the predetermined number of codewords.

In some aspects, the techniques described herein relate to a method, wherein generating the compressed data includes normalizing weights associated with each of the predetermined number of codewords to 1.

In some aspects, the techniques described herein relate to a method, further including providing an index for each codeword of the predetermined number of codewords to a receive side, wherein each index indicates a codeword in a codebook at the receive side.

In some aspects, the techniques described herein relate to a method, further including providing an index for each codeword of the predetermined number of codewords to a receive side as forward error correction data.

In some aspects, the techniques described herein relate to a method, wherein providing the compressed data includes providing a weight for at least one codeword of the predetermined number of codewords.

In some aspects, the techniques described herein relate to a method, wherein generating the compressed data further includes determining a residual value between the compressed data and data indicated by the predetermined number of codewords.

In some aspects, the techniques described herein relate to a method, wherein obtaining the data to be compressed includes obtaining residual data indicative of a difference between previously compressed data and decompressed data.

In some aspects, the techniques described herein relate to a method, wherein obtaining the data to be compressed includes obtaining a subspace of a product quantization system.

In some aspects, the techniques described herein relate to a method, wherein selecting the predetermined number of codewords of the plurality of codewords includes selecting the predetermined number of codewords based upon an intended bitrate for the data to be compressed.

In some aspects, the techniques described herein relate to a method including: obtaining compressed data; determining a plurality of codewords from the compressed data; determining a weight for each of the plurality of codewords; and determining decompressed data from the plurality of codewords and the weight for each of the plurality of codewords.

In some aspects, the techniques described herein relate to a method, wherein determining the plurality of codewords includes determining a codebook index for each of the plurality of codewords from the compressed data.

In some aspects, the techniques described herein relate to a method, wherein determining the weight for each of the plurality of codewords includes determining weights from the compressed data.

In some aspects, the techniques described herein relate to a method, wherein determining the weight for each of the plurality of codewords includes determining weights for all but one of the plurality of codewords from the compressed data and determining the weight for the one of the plurality of codewords from the weights for all but one of the plurality of codewords.

In some aspects, the techniques described herein relate to a method, wherein determining the weight for each of the plurality of codewords is based upon operation of a codec used in compression of data to produce the compressed data.

In some aspects, the techniques described herein relate to one or more tangible, non-transitory computer readable mediums encoded with instructions, wherein the instructions, when executed by one or more processors, are operable to: obtain data to be compressed; determine a distance between the data to be compressed and each codeword of a plurality of codewords; select a predetermined number of codewords of the plurality of codewords based on the distance between the data to be compressed and each of the predetermined number of codewords; and generate compressed data, where the compressed data includes an indication of the predetermined number of codewords of the plurality of codewords.

In some aspects, the techniques described herein relate to one or more tangible, non-transitory computer readable mediums, wherein the instructions operable to generate the compressed data include instructions operable to determine a weight associated with each of the predetermined number of codewords.

In some aspects, the techniques described herein relate to one or more tangible, non-transitory computer readable mediums, wherein the instructions operable to generate the compressed data include instructions operable to determine a residual value between the compressed data and data indicated by the predetermined number of codewords.

In some aspects, the techniques described herein relate to one or more tangible, non-transitory computer readable mediums, wherein the instructions operable to obtain the data to be compressed include instructions operable to obtain residual data indicative of a difference between previously compressed data and decompressed data.

In some aspects, the techniques described herein relate to one or more tangible, non-transitory computer readable mediums, wherein the instructions operable to obtain the data to be compressed include instructions operable to obtain a subspace of a product quantization system.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A method comprising:
   obtaining a stream of input vectors to be compressed;
   for each of the input vectors:
   determining a distance between the input vector to be compressed and each codeword of a plurality of codewords; and
   selecting two or more codewords of the plurality of codewords based on the distance between the input vector to be compressed and each of the two or more codewords; and
   generating compressed data that comprises an indication of the two or more codewords of the plurality of codewords.

2. The method of claim 1, wherein generating the compressed data further comprises determining a weight associated with each of the two or more codewords.

3. The method of claim 2, wherein generating the compressed data comprises normalizing weights associated with each of the two or more codewords to 1.

4. The method of claim 1, further comprising providing an index for each codeword of the two or more codewords to a receive side, wherein each index indicates a codeword in a codebook at the receive side.

5. The method of claim 1, further comprising providing an index for each codeword of the two or more codewords to a receive side as forward error correction data.

6. The method of claim 1, wherein generating the compressed data comprises generating a weight for at least one codeword of the two or more codewords.

7. The method of claim 1, wherein generating the compressed data further comprises determining a residual value between the compressed data and data indicated by the two or more codewords.

8. The method of claim 1, wherein obtaining the stream of input vectors to be compressed comprises obtaining residual data from a vector quantization compression stage.

9. The method of claim 1, wherein obtaining the stream of input vectors to be compressed comprises obtaining a subspace of a product quantization system.

10. The method of claim 1, wherein selecting the two or more codewords of the plurality of codewords comprises selecting the two or more codewords based upon an intended bitrate for the stream of input vectors to be compressed.

11. A method comprising:
obtaining a stream of compressed data elements; and
for each of the compressed data elements:
determining a plurality of codewords from the compressed data element;
determining a weight for each of the plurality of codewords; and
determining a decompressed data element from the plurality of codewords and the weight for each of the plurality of codewords.

12. The method of claim 11, wherein determining the plurality of codewords comprises determining a codebook index for each of the plurality of codewords from the compressed data element.

13. The method of claim 11, wherein determining the weight for each of the plurality of codewords comprises determining weights from the compressed data element.

14. The method of claim 11, wherein determining the weight for each of the plurality of codewords comprises determining weights for all but one of the plurality of codewords from the compressed data element and determining the weight for the one of the plurality of codewords from the weights for all but one of the plurality of codewords.

15. The method of claim 11, wherein determining the weight for each of the plurality of codewords is based upon operation of a codec used in compression of data to produce the compressed data element.

16. One or more tangible, non-transitory computer readable mediums encoded with instructions, wherein the instructions, when executed by one or more processors, are operable to:
obtain a stream of input vectors to be compressed;
for each of the input vectors:
determine a distance between the input vector to be compressed and each codeword of a plurality of codewords; and
select two or more codewords of the plurality of codewords based on the distance between the input vector to be compressed and each of the two or more codewords; and
generate compressed data that comprises an indication of the two or more codewords of the plurality of codewords.

17. The one or more tangible, non-transitory computer readable mediums of claim 16, wherein the instructions operable to generate the compressed data comprise instructions operable to determine a weight associated with each of the two or more codewords.

18. The one or more tangible, non-transitory computer readable mediums of claim 16, wherein the instructions operable to generate the compressed data comprise instructions operable to determine a residual value between the compressed data and data indicated by the two or more codewords.

19. The one or more tangible, non-transitory computer readable mediums of claim 16, wherein the instructions operable to obtain the stream of input vectors to be compressed comprise instructions operable to obtain residual data from a vector quantization compression stage.

20. The one or more tangible, non-transitory computer readable mediums of claim 16, wherein the instructions operable to obtain the stream of input vectors to be compressed comprise instructions operable to obtain a subspace of a product quantization system.

* * * * *